(12) United States Patent
Wasselin et al.

(10) Patent No.: US 11,835,617 B2
(45) Date of Patent: *Dec. 5, 2023

(54) METHOD AND DEVICE FOR DETERMINING AN OPERATIONAL GEOGRAPHICAL ZONE OBSERVED BY A SENSOR

(71) Applicant: Rockwell Collins France S.A.S., Blagnac (FR)

(72) Inventors: Jean-Philippe Wasselin, Toulouse (FR); Julien Galiere, Miremont (FR)

(73) Assignee: Rockwell Collins France S.A.S., Blagnac (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/945,384

(22) Filed: Sep. 15, 2022

(65) Prior Publication Data

US 2023/0057370 A1 Feb. 23, 2023

Related U.S. Application Data

(63) Continuation of application No. 16/317,507, filed as application No. PCT/FR2017/051894 on Jul. 11, 2017, now Pat. No. 11,480,666.

(30) Foreign Application Priority Data

Jul. 12, 2016 (FR) ...................... 1656697

(51) Int. Cl.
*G01S 13/56* (2006.01)
*G01S 13/50* (2006.01)
(Continued)

(52) U.S. Cl.
CPC .............. *G01S 13/56* (2013.01); *G01S 13/50* (2013.01); *G06F 30/20* (2020.01); *G01S 13/886* (2013.01)

(58) Field of Classification Search
CPC ........ G01S 13/56; G01S 13/886; G01S 13/50; G06F 17/5009; G06F 30/20
See application file for complete search history.

(56) References Cited

U.S. PATENT DOCUMENTS

| 2 A * | 7/1836 | Goulding ............... D01G 21/00 57/58.49 |
| 6,208,248 B1 * | 3/2001 | Ross ................... G01S 13/0209 340/552 |

(Continued)

FOREIGN PATENT DOCUMENTS

| AU | 2006253148 A1 * | 12/2006 | ............. G01S 13/34 |
| AU | 2006253148 B2 | 12/2010 | |

(Continued)

OTHER PUBLICATIONS

A. Lin and H. Ling, "Doppler and direction-of-arrival (DDOA) radar for multiple-mover sensing," in IEEE Transactions on Aerospace and Electronic Systems, vol. 43, No. 4, pp. 1496-1509, Oct. 2007, doi: 10.1109/TAES.2007.4441754. (Year: 2007).*

(Continued)

*Primary Examiner* — Berhanu Tadese
(74) *Attorney, Agent, or Firm* — Suiter Swantz pc llo (57) ABSTRACT

A method for determining an operational geographical zone relative to a sensor may include a step of simulating the position of said sensor; a step of determining a first zone of the region of interest; and a step of determining a second zone of the region of interest. The region of interest of the first zone may be constituted by points at each of which said object at that point traveling at a speed greater than or equal to said speed VT and in a given direction, would be seen by the sensor as having a radial speed greater than a threshold speed defined for that point. The operational geographical (Continued)

zone. may be defined by taking account of the intersection of the first zone and of a coverage zone of the sensor.

14 Claims, 11 Drawing Sheets

(51) Int. Cl.
*G06F 30/20* (2020.01)
*G01S 13/88* (2006.01)

(56) References Cited

U.S. PATENT DOCUMENTS

| | | | | |
|---|---|---|---|---|
| 10,494,108 | B1 * | 12/2019 | Finley | B64D 43/00 |
| 10,636,166 | B1 * | 4/2020 | Armstrong | G06V 20/13 |
| 11,480,666 | B2 * | 10/2022 | Wasselin | G01S 13/56 |
| 2003/0062431 | A1 * | 4/2003 | Sonehara | F26B 17/284 |
| | | | | 241/23 |
| 2003/0112142 | A1 * | 6/2003 | Izumi | G01S 13/56 |
| | | | | 340/552 |
| 2008/0275618 | A1 * | 11/2008 | Grimm | G08G 1/162 |
| | | | | 701/96 |
| 2015/0347673 | A1 * | 12/2015 | Wang | G06Q 30/02 |
| | | | | 703/2 |
| 2019/0250262 | A1 * | 8/2019 | Karthick Nagaraj | G01S 13/52 |
| 2019/0293775 | A1 * | 9/2019 | Wasselin | G01S 13/50 |
| 2021/0149052 | A1 * | 5/2021 | Amano | G01S 17/89 |
| 2023/0057370 | A1 * | 2/2023 | Wasselin | G01S 13/50 |

FOREIGN PATENT DOCUMENTS

| | | | | | |
|---|---|---|---|---|---|
| AU | 2006253148 | B2 * | 12/2010 | | G01S 13/34 |
| AU | 2006253148 | | 1/2011 | | |
| AU | 2006253148 | B9 * | 1/2011 | | G01S 13/34 |
| CA | 2610177 | A1 * | 12/2006 | | G01S 13/34 |
| CA | 2610177 | A1 | 12/2006 | | |
| CA | 2610177 | C | 5/2014 | | |
| CA | 2610177 | C * | 5/2014 | | G01S 13/34 |
| EP | 814347 | A1 * | 12/1997 | | G01S 13/60 |
| EP | 814347 | B1 | 8/2002 | | |
| EP | 3485292 | A1 | 5/2019 | | |
| EP | 3485292 | A1 * | 5/2019 | | G01S 13/50 |
| FR | 2838852 | A1 * | 10/2003 | | A61B 6/5282 |
| FR | 2838852 | A1 | 10/2003 | | |
| FR | 2936195 | A1 * | 3/2010 | | B60Q 1/143 |
| FR | 2936195 | B1 | 8/2011 | | |
| FR | 3015731 | A1 | 6/2015 | | |
| FR | 3015731 | A1 * | 6/2015 | | G06K 9/00201 |
| FR | 3015732 | A1 * | 6/2015 | | G06K 9/00208 |
| FR | 3015732 | A1 | 6/2015 | | |
| FR | 3050528 | A1 * | 10/2017 | | G01N 21/474 |
| FR | 3050528 | A1 | 10/2017 | | |
| FR | 3054042 | A1 * | 1/2018 | | G01S 13/50 |
| FR | 3054042 | A1 | 1/2018 | | |
| FR | 3054042 | B1 | 8/2018 | | |
| FR | 3054042 | B1 * | 8/2018 | | G01S 13/50 |
| WO | 2014013159 | A1 | 1/2014 | | |
| WO | 2018011511 | A1 | 1/2018 | | |
| WO | WO-2018011511 | A1 * | 1/2018 | | G01S 13/50 |

OTHER PUBLICATIONS

International Search Report for PCT/FR2017/051894 dated Oct. 13, 2017. 3 pages.

Lin A., et al: "Doppler and direction-of-arrival (DDOA) radar for multiple-mover sensing", IEEE Transactions on Aerospace and Electronics Systems, vol. 43, No. 4, Oct. 1, 2007 (Oct. 1, 2007), 14 pages.

* cited by examiner

METHOD AND DEVICE FOR DETERMINING AN OPERATIONAL GEOGRAPHICAL ZONE OBSERVED BY A SENSOR

CROSS REFERENCE TO RELATED APPLICATIONS

The present application constitutes a continuation application of and claims priority to U.S. patent application Ser. No. 16/317,507, filed on Jan. 11, 2019, entitled METHOD AND DEVICE FOR DETERMINING AN OPERATIONAL GEOGRAPHICAL ZONE OBSERVED BY A SENSOR which is a National Stage Application of PCT/FR2017/051894, filed Jul. 11, 2017, which claims the benefit of and priority to French Patent Application No. 1656697, filed Jul. 12, 2016, the entire contents of which are incorporated herein by reference in their entirety.

BACKGROUND OF THE INVENTION

The present invention relates to a method and to a device for assisting in placing a sensor, e.g. a Doppler radar. In the present state of the art, a widespread approach for placing a Doppler radar consists in superposing a coverage zone of the radar on a background map showing the surveillance zone. The positioning is performed by the operator taking account of the characteristics of the site (presence of obstacles, possibilities for installation), of operational needs (coverage of zones that are particularly sensitive), and of characteristics of the radar (variations in detection performance between the core and the ends of the coverage zone of the radar). The invention seeks a method for facilitating the positioning of a Doppler radar, and more generally of a sensor.

OBJECT AND SUMMARY OF THE INVENTION

Thus, in a first aspect, the invention provides a determination method for determining at least one operational geographical zone in a region of interest, said zone being determined relative to a sensor configured to observe and measure the radial speed of an object traveling at a non-zero minimum speed "VT" in the region of interest.

The method comprises:
- a step of simulating the position of the sensor in the region of interest at a position and in an orientation that are determined;
- a step of determining at least one first zone of the region of interest that is constituted by points for each of which, the object at that point and traveling at a speed greater than or equal to the speed VT and in at least one given direction "DT", would be seen from the sensor to have a radial speed greater than a threshold value defined for that point; and
- a step of determining a second zone of the region of interest, the second zone constituting a coverage zone of the sensor in which said object is observable while taking account at least of the intrinsic characteristics of the sensor and of the intrinsic characteristics of the object, and also of the position of the object relative to the sensor; the operational geographical zone being defined by taking account of the intersection of at least these two zones.

Thus, and in general manner, the invention proposes determining the positions of the sensor at which an object traveling at a speed greater than or equal to a given speed VT and in a given direction DT is visible to the sensor.

This zone is referred to as an "operational zone" in the meaning of the invention. The operational zone is thus defined by the intersection of at least two zones, namely:
- a first zone defined essentially as a function of sensitivity of the sensor defined for the various points of the region of interest in terms of speed threshold, without taking account of the orientation of the sensor; and
- the coverage zone of the sensor defined as a function of the intrinsic characteristics of the sensor, of the intrinsic characteristics of the object to be observed, and, except in the special situation of a sensor with an isotropic antenna, of the orientation of the sensor. In an embodiment of the invention, the sensor is a Doppler radar.

Determining settings for the determination method of the invention consists in determining the sensitivity of the sensor by setting speed thresholds at the various points in the region of interest. More precisely, the greater the desire to be able to detect objects at a given point in the region of interest, the lower the threshold speed at that point needs to be selected. The sensitivity of the sensor is said to be "high" since numerous objects (e.g. the leaves of a tree stirred by the wind) become visible to the sensor.

Conversely, by increasing the speed threshold at a point, the sensitivity of the sensor is reduced, which can be advantageous for avoiding false positives. In an implementation, the method includes a step of displaying the position of the sensor, together with the first zone and the second zone in the region of interest, e.g. on a computer screen. This display makes it easy for an operator to verify whether a position of the sensor makes it possible to carry out effective surveillance of a portion of the region of interest against intrusions of an object traveling at some given minimum speed and in a given direction.

The operator can also evaluate the extent to which the sensitivity adjustment of the sensor at various different points has an impact on the effectiveness of the method in carrying out surveillance of a portion of the region of interest. Optionally, shadow zones and interference zones may also be shown. In an implementation of the invention, the threshold speeds defined at all of the points of the region of interest are equal to a constant.

In this implementation, the first zone presents the simple shape of two angular sectors that meet at their vertices, which correspond to the position of the sensor, and that have a bisector corresponding to the given direction, with an aperture that is determined by the sensitivity of the sensor, in other words the constant threshold speed in the region of interest. It should be observed that this first zone is not oriented as a function of the antenna pattern of the sensor, but by the direction of the intrusion path. This implementation presents the advantage of being able to use a simple sensor that need not supply the bearings nor the distances of objects that are detected. It can be implemented using an unmodulated continuous wave Doppler radar having an antenna constituted by a simple dipole. Compared with continuous wave radars with modulated transmission, this type of radar presents the advantage of needing a processing system that is simpler.

Since it no longer needs to provide the bearing, the design of the antenna and of its processing system can be greatly simplified. An antenna constituted by a simple dipole is particularly compact and simple compared with an antenna that gives a bearing measurement by making use of mechanical scanning, or relative to an antenna made up of a plurality of mutually spaced-apart dipoles and measuring the phase differences of the signals they receive, which requires additional processing that is unnecessary in this implementation. Because of its geometry, the first zone may be referred to as a "Doppler rose" by a person skilled in the art of radars or of aerial navigation. In a particular implementation, the threshold speed defined for at least one point of said region of interest is defined as a function of the position of that point relative to said sensor. This implementation thus makes it possible to adjust the sensitivity of the sensor at different points in the region of interest.

It is particularly advantageous when the region of interest has a plurality of zones presenting uniform characteristics. For example, if the region of interest has an unobstructed zone where the risk of detecting false positives is low, it may be advantageous to increase sensitivity in this zone, in other words to lower the threshold speed for points in that zone in order to increase the chances of detection.

For example, the threshold speed defined for at least one point of the region of interest is defined as a function of the distance between that point and the sensor. This implementation is particularly advantageous in that, while still using a sensor that is simple and that does not require bearing to be measured, it is capable of satisfying a need to install the sensor in an unobstructed zone that is surrounded by zones of vegetation.

It is thus possible to increase the sensitivity in the unobstructed zone close to the sensor, in other words to lower the threshold speed for points in that zone in order to increase the chances of detection, while also reducing sensitivity, in other words increasing the threshold speed, for points situated outside the unobstructed zone.

A sensor in which the threshold speed cannot be defined as a function of distance must either reduce its sensitivity, in other words increase the threshold speed over the entire region of interest in order to avoid false positives, or else, where the sensor makes this possible, it must increase its sensitivity while limiting the range of the sensor to the unobstructed zone.

Figure 1:
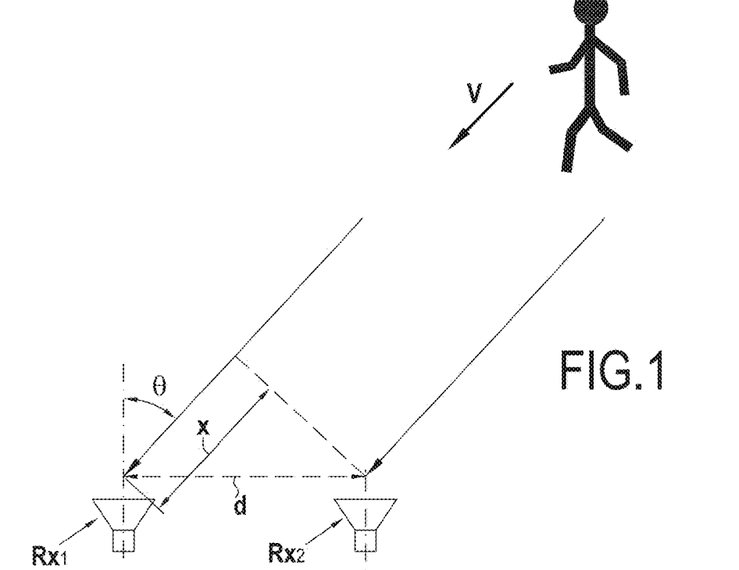
FIG. 1, described above, shows the prior art with an antenna suitable for measuring the bearing of an object.

In an implementation, the threshold speed defined for at least one point of the region of interest is defined as a function of the bearing of that point relative to the reference direction linked to the sensor, e.g. the axis of the main lobe for a sonar or a radar having a directional antenna. This implementation can be envisaged only if the sensor can measure the bearings of the points that it observes. On this topic, prior art FIG. 1 illustrates a known example of an antenna having a transmitter TX and two receivers RX1 and RX2 that are spaced apart from each other, and that are situated at respective distances d1 and d2 from an object T in order to measure the bearing 0 of the object T by a phase monopulse as described in detail in the article "Doppler and direction-of-arrival (DDOA) radar for multiple-mover sensing" (doi:10.1109/TAES.2007.4441754) published in the journal IEEE Transactions on Aerospace and Electronic Systems, Vol. 43, No. 4, October 2007, page 1497.

Figure 2:
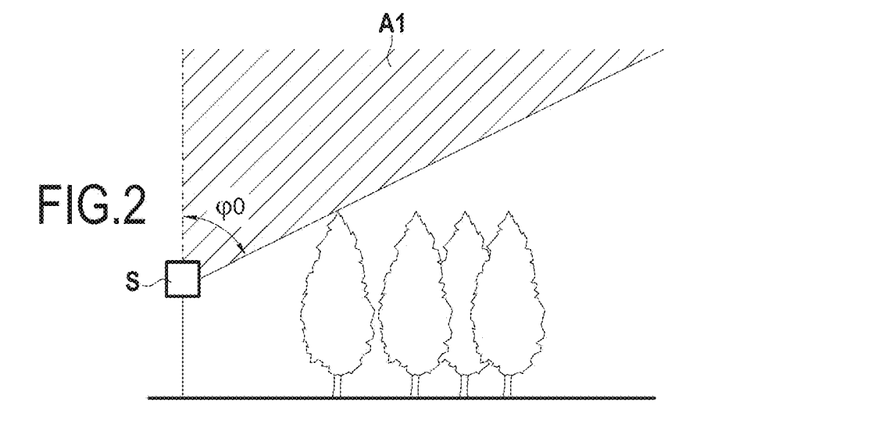
FIG. 2, described above, shows a first high-sensitivity zone for elevation angles corresponding to a zone without foliage.
Figure 3:
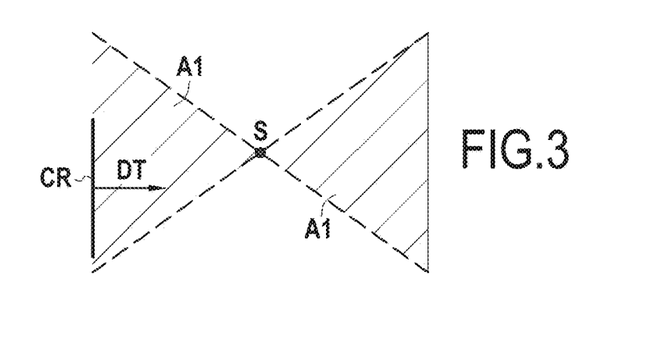
FIG. 3, described above, shows a first zone for a given travel direction of the object.

For example, if the sensor is positioned at the end of an asphalt road passing through a wooded zone, it may be advantageous to increase the sensitivity of the sensor for points on that road, in other words for points in the region of interest at a bearing, as seen from the sensor, that corresponds to the direction of that road. In a particular implementation, the threshold speed defined for at least one point of the region of interest is defined as a function of the elevation of that point relative to said sensor. With reference to FIG. 2, this implementation serves for example to be able to increase the sensitivity of the sensor, e.g. to lower the threshold speed, for a first zone A1 without foliage as defined by an angle of elevation less than a value O, e.g. in order to observe objects flying at very low radial speed, such as drones. When the threshold speed defined for a point of the region of interest varies as a function of the distance, of the bearing, and/or of the elevation of that point relative to the sensor, the geometry of the first zone may be of arbitrary shape. In accordance with the invention, the first zone is defined for a given travel direction of the object. If the invention is used to position a sensor in order to provide surveillance of a straight fence CR as shown in FIG. 3, this direction DT is preferably selected to be in the preferred direction for crossing the fence, i.e. substantially perpendicular to the fence, regardless of the position or the orientation of the sensor S. In a particular implementation, the method of the invention makes it possible to determine a plurality of first zones for the same travel speed VT of the object, these first zones being determined for different travel directions of the object.

Figure 4A:
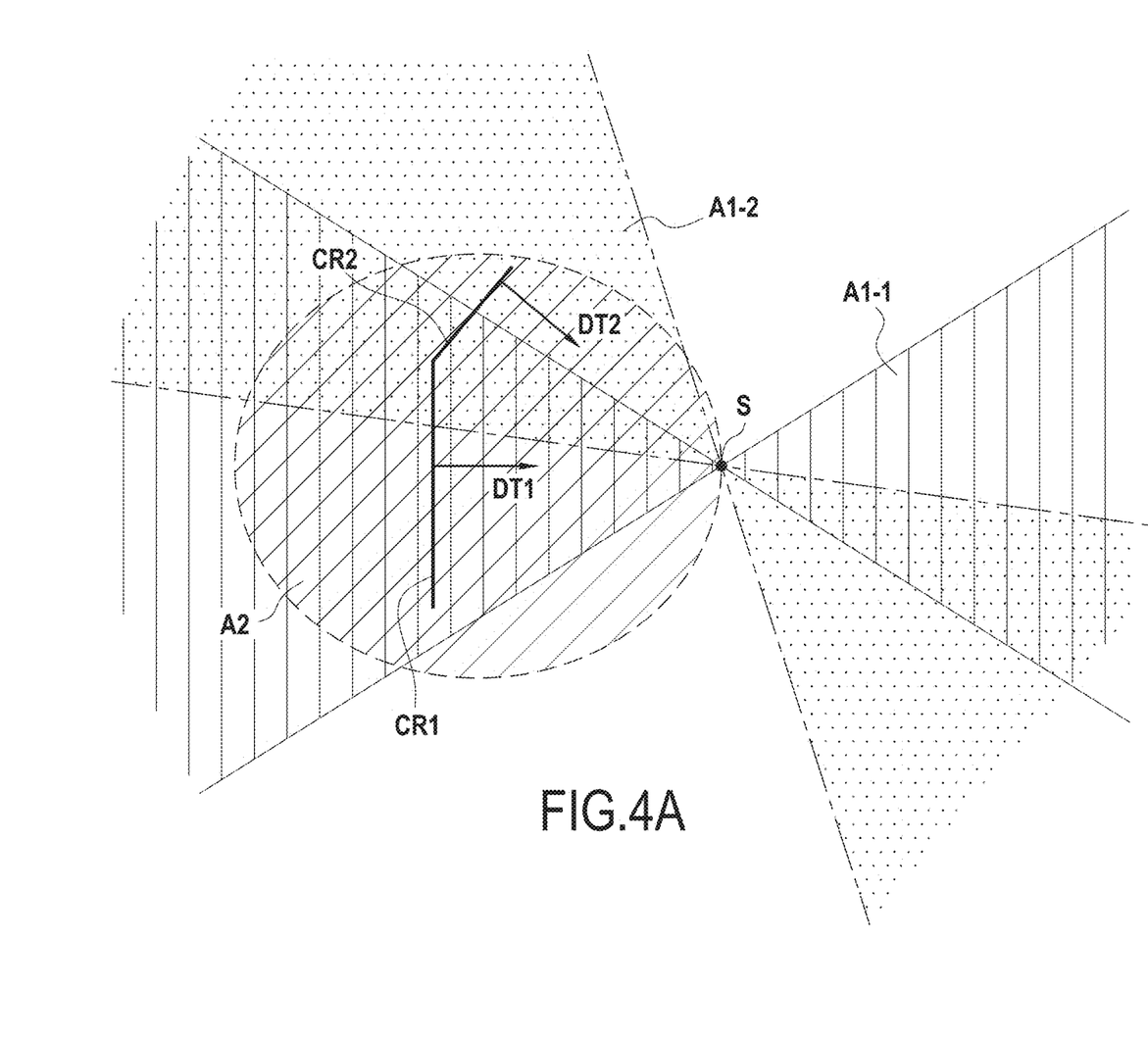
FIG. 4A, described above, shows the second zone and two first zones for two given travel directions of the object.

As shown in FIG. 4A, this implementation of the invention can be used advantageously to perform surveillance of an angled fence CA made up of two non-parallel straight portions, the travel directions DT1 and DT2 of the object being selected to be substantially perpendicular to each of those two portions. In the particular implementation shown in FIG. 4A, the first zones Al.1 and Al.2 obtained for each of the travel directions DT1 and DT2 of the object are shown in different manners, e.g. using different colors or different patterns. By taking the example of two first zones, the person skilled in the art can understand that the operational zones in the meaning of the invention, i.e. the zones in which an object traveling at a speed greater than or equal to a given speed VT and in one or the other of the given directions DT is visible to the sensor, are the zones that are obtained respectively by the intersection between the first zone Al-1 and the second zone A2 and also by the intersection between the first zone Al-2 and the second zone A2, as shown respectively in FIGS. 4B and 4C.

Figure 4B:
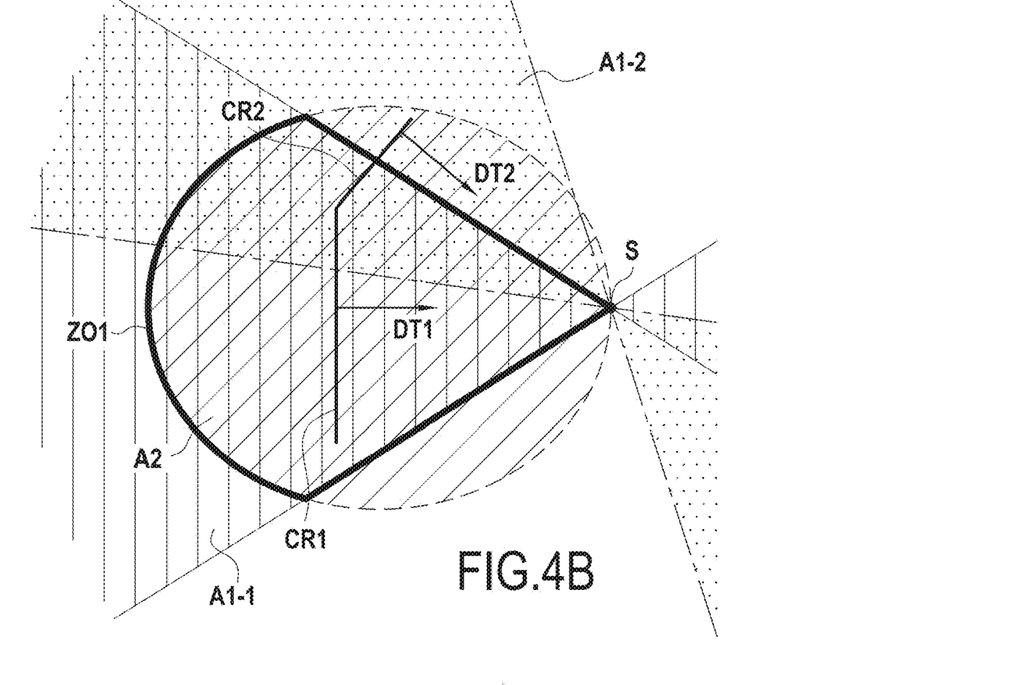
FIGS. 4B and 4C, described above, show the operational zones obtained for two given travel directions of the object.
Figure 4C:
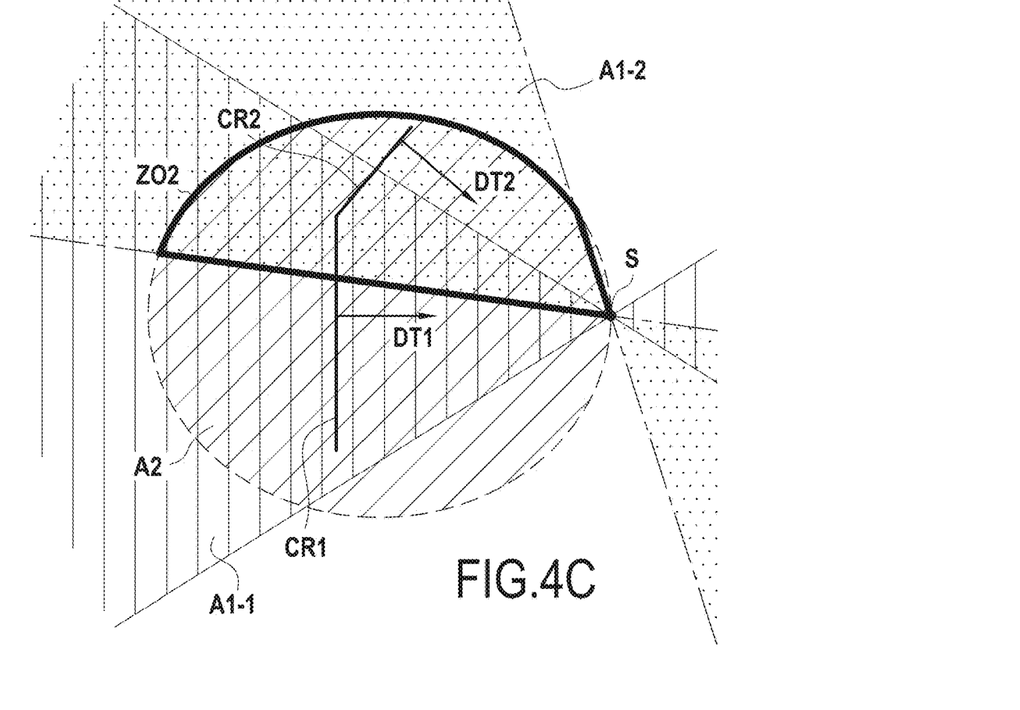

These figures show that the intersection zone obtained for the sensor as positioned in this way overlap respectively the fence portion CR1 for the detection DT1 and the fence portion CR2 for the detection DT2. When for practical reasons the sensor can be positioned at a position that makes it possible to define such an intersection zone that covers the region that is to be protected effectively, the operator looks for a position for the sensor that gives optimized coverage, either by trial and error, or else by performing a method in accordance with the invention for assisting in installing a sensor. Specifically, in a second aspect, the invention provides a method of assisting in installing a sensor configured to observe and measure a radial speed of an object traveling at a non-zero minimum speed "VT" and in at least one given direction "DT" in a region of interest, the method comprising:

at least one iteration, each iteration comprising determining an operational geographical zone of the sensor by simulating the sensor being positioned in the region of interest at a determined position and in a determined orientation, by performing an above-mentioned method of determining such a zone;

a step of determining at least one preferred position among the positions enabling an optimized operational geographical zone to be determined in accordance with an optimization criterion; and a step of reproducing this or these preferred position(s).

The invention, thus proposes a method making it possible to optimize automatically the position of the sensor as a function of a predetermined optimization criterion. By way of example, the optimization criterion may serve to obtain the widest geographical zone, while possibly complying with other constraints, such as for example the constraint of necessarily being able to cover a defined zone in the region of interest. In accordance with the invention, the operational zone is obtained from the intersection of the first zone(s) and the second zone in the meaning of the invention.

Figure 5:
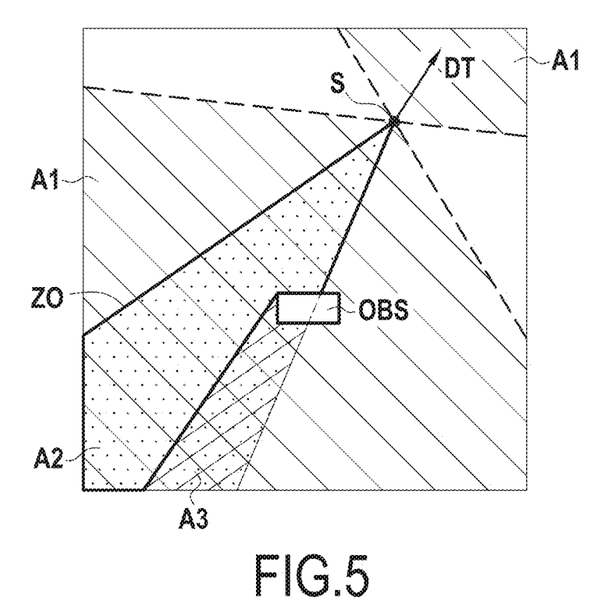
FIG. 5, described above, shows an operational zone defined by taking a shadow zone into account.

In implementations of the method of the invention for providing assistance in installing a sensor, and as shown in FIG. 5, the operational zone ZO takes account of the intersection between the first zone(s) and the second zone (respectively A1 and A2) with the complement of at least one shadow zone A3, this at least one shadow zone taking account of characteristics in said region of interest.

This shadow zone is typically constituted by points in the region of interest that correspond to positions at which the object cannot be observed by the sensor S while the sensor is in its simulated position, e.g. because of the presence of a building B.

Figure 6:
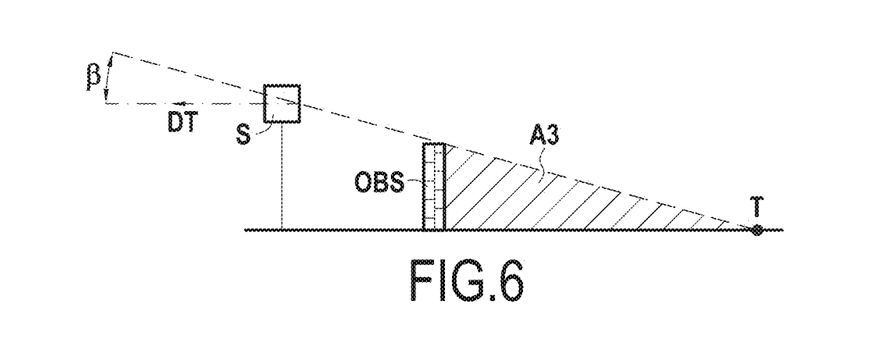
FIG. 6, described above, shows a shadow zone.

By way of example, and as shown in FIG. 6, a shadow zone A3 may be constituted by a zone that seen from the sensor Sis situated behind a relief or an obstacle OBS, such that an object T positioned in this zone cannot be observed by the sensor. In this figure, the angle formed between the travel direction DT of the object and the straight line connecting the target to the sensor is marked—In a variant, the shadow zone is not taken into account when calculating the operational zone, however it is shown to the user.

In implementations of the invention, the determination method of the invention also includes a step of determining an interference zone for taking account of characteristics in said region of interest. This zone may typically be constituted by points in the region of interest that correspond to positions where said object might not be detected by the sensor so long as it is in its simulation position. By way of example, such an interference zone may be constituted by a busy road.

It may be shown to the user with a representation that is different from the representations used for showing the first and second zones, and the shadow zones, if any. The invention also provides a device for determining at least one operational geographical zone in a region of interest, the zone being determined relative to a sensor configured to observe and measure the radial speed of an object traveling at a non-zero minimum speed "VT" in the region of interest. The device comprises:

a unit for simulating the sensor being positioned in the region of interest at a determined position and in a determined orientation;

a unit for determining at least one first zone of the region of interest that is constituted by points at each of which, the object at that point and traveling at a speed greater than or equal to the speed VT and in a given direction "DT", would be seen by the sensor to have a radial speed greater than a threshold speed defined for that point; and a unit for determining a second zone of the region of interest, the second zone constituting a coverage zone of the sensor in which the object is observable while taking account at least of the intrinsic characteristics of the sensor and of the intrinsic characteristics of the object, and also of the position of the object relative to the sensor; the operational geographical zone being defined by taking account of the intersection of at least the first and second zones.

The invention also provides a device for assisting installing a sensor that is configured to observe and measure the radial speed of an object traveling at a non-zero minimum speed "VT" and in at least one given direction "DT" in a region of interest.

The device comprises:

a controller configured to execute at least one iteration, each iteration comprising determining an operational geographical zone of the sensor by simulating the sensor being positioned in the region at a determined position and in a determined orientation, by implementing an above-mentioned method of determining such a zone;

a unit for determining at least one preferred position from among the positions enabling an optimized operational geographical zone to be determined in accordance with an optimization criterion; and a unit for representing the preferred position(s) In a particular implementation, the various steps of the method of determining an operational geographical zone and/or the method of assisting in installing a sensor, as mentioned above, are determined by computer program instructions.

Consequently, the invention also provides a computer program on a data medium, the program including instructions adapted to performing steps of a method of determining an operational geographical zone and/or a method of assisting in installing a sensor, as mentioned above.

The program may use any programming language, and be in the form of source code, object code, or code intermediate between source code and object code, such as in a partially compiled form, or in any other desirable form.

The invention also provides a computer-readable data medium including instructions of a computer program as mentioned above. The data medium may be any entity or device capable of storing the program. For example, the medium may comprise storage means, such as a read only memory (ROM), e.g. a compact disk (CD) ROM, or a microelectronic circuit ROM, or indeed magnetic recording means, e.g. a hard disk. Furthermore, the data medium may be a transmissible medium such as an electrical or optical signal, suitable for being conveyed via an electrical or optical cable, by radio, or by other means. The program of the invention may in particular be downloaded from an Internet type network. Alternatively, the data medium may be an integrated circuit in which the program is incorporated, the circuit being adapted to execute or to be used in the execution of the method in question.

DETAILED DESCRIPTION OF EMBODIMENTS OF THE INVENTION

Figure 7:
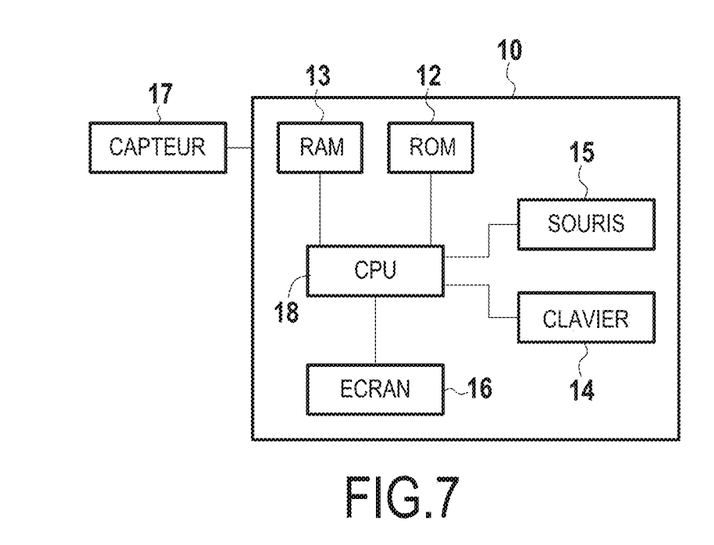
FIG. 7 is a diagram of a device for assisting in installing a sensor in accordance with a particular embodiment of the invention.

There follows a detailed description of non-limiting embodiments of the invention. FIG. 7 is a diagram showing a device 10 for assisting in installing a sensor in accordance with a particular embodiment of the invention. In this particular embodiment, the device has the conventional architecture of a computer. In particular, it comprises a processor 11, a ROM 12, a random access memory (RAM) 13, a keyboard 14, a mouse 15, and a screen 16. The device may be connected to a sensor 17. In the presently-described embodiment, only one sensor is used, which sensor comprises a single-lobe anisotropic antenna.

In an alternative embodiment, the device 10 does not use a keyboard or a mouse, but rather a touch screen that serves both to input information and to display it.

In this embodiment, the device 10 may be constituted by a smartphone or a touch tablet, possibly connected to a server. The ROM 12 constitutes a data medium in accordance with the invention. It stores a computer program PG in accordance with the invention. The computer program PG includes instructions for executing steps of a method of assisting in installing a sensor in accordance with an implementation of the invention, with the main steps of the method being described below with reference to FIG. 8.

In the presently-described embodiment, the ROM 12 of the computer also includes a digital map showing a region of interest ROI including a surveillance zone ZS. This digital map may be displayed on the screen 16 of the computer. The keyboard 14 and the mouse 15 may be used by the operator to input configuration settings for the method of assisting installation, e.g.:

the perimeters of the region of interest ROI and of the surveillance zone ZS;

Optionally, the obstacles and the relief in the region of interest ROI serve to calculate potential shadow zones;

the characteristics of the object T to be observed, e.g. a person, a type of vehicle, . . . , a minimum travel speed VT of the object;

one or more travel directions DT of the object;

threshold speeds Vmin i at the various points Ti of the region of interest ROI;

an optimization criterion for installing the sensor;

an option enabling the operator to take account of potential shadow zones while determining the operational zone of the sensor;

optionally the characteristics and the locations of sources of interference, serving in particular to determine potential zones of interference; and the position POS and the orientation y of the sensor, in the "manual" mode of operation as described below. These settings may be saved in the ROM 12.

Figure 9:
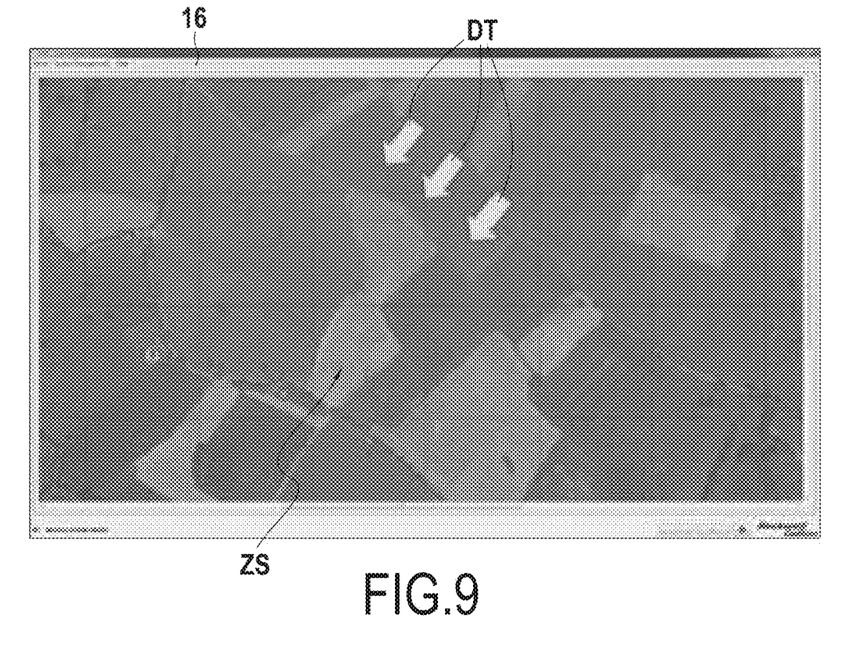
FIG. 9 shows the display on the screen of the FIG. 7 device, showing a region of interest, a surveillance zone, and a travel direction of an object.

FIG. 9 shows the display on the screen 16 of a region of interest ROI, of a surveillance zone ZS, and of a travel direction DT of an object. In the presently-described embodiment, the man/machine interface of the computer 10 provides the user with two modes of operation:

in a so-called "manual" mode, the operator selects a position POS for the sensor S, and if the sensor is anisotropic, an orientation y, e.g. by clicking with the mouse on the digital map, and the computer program PG determines and displays on the screen 16 the operational zone of the sensor S when in this position POS for the speed VT and the travel direction(s) of the object T; and in a so-called "automatic" mode, the computer program calculates and displays to the operator on the screen 16 one or more preferred positions and/or orientations for the sensor in order to optimize the geographical zone, which zone is optimized in compliance with an optimization criterion.

In general manner, and as mentioned above, the operational zone Z corresponds to the positions in which an object is visible to the sensor and is defined by the intersection between at least one first zone A1 and a zone A2, which zones are described in greater detail below.

Concerning the First Zone A1

It should be recalled that a point Ti of the region of interest ROI belongs to the first zone Al if, and only if, an object at the point Ti traveling at a given speed VT and in a given direction DT has, when seen from the sensor S, a radial speed Vr that is greater than a threshold speed Vmin i defined for that point.

Figure 10:
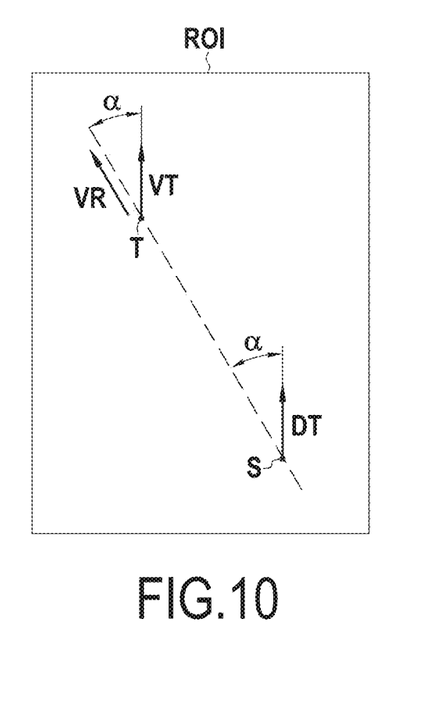
FIG. 10 shows a radial speed calculation.

FIG. 10 illustrates these concepts. It shows a sensor S positioned in a region of interest ROI and an object T traveling in this region at a speed VT in a direction DT. The radial component (or radial speed) Vr of this object T forms an angle a with the direction DT, such that:

$$Vr = VT \cdot \cos a$$

when the direction DT, the sensor, and the object are all situated in the horizontal plane.

In the general situation, if the angle formed between the direction DT and the straight line connecting the target to the sensor is written, as shown in FIG. 6, then:

$$Vr = VT \times \cos a \times \cos$$

Figure 11:
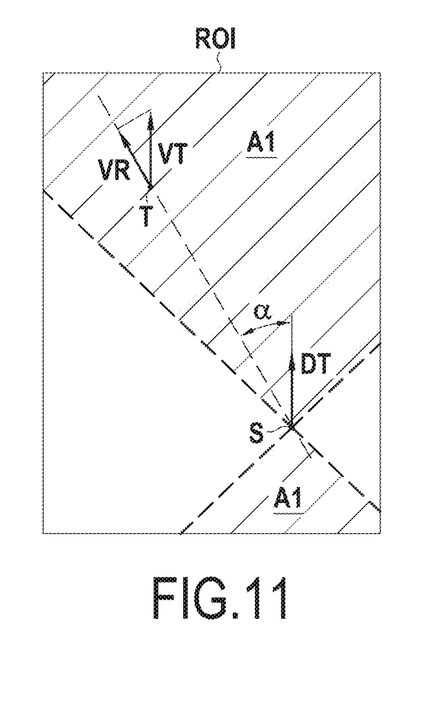
FIG. 11 shows a first zone for a given travel direction of the object.

FIG. 11 shows such a first zone Al shaded for when the threshold speeds Vmin i associated with the various points in the region of interest ROI are all equal to the same constant Vmin.

This first zone Al in this implementation is in the form of two angular sectors:

that meet at their vertices at a position corresponding to the position of the sensor S;

of bisector corresponding to the direction DT; and of aperture 2a0 associated with the sensitivity Vmin of the sensor, where:

a0=arccos(Vmin/VT)

In other words, at constant speed VT, the more it is desired to be able to detect objects, the lower the value that needs to be given to the threshold speed Vmin, such that a0 tends towards n/2.

In this implementation, the sensitivity of the Doppler sensor is said to be high, since numerous objects (e.g. vegetation stirred by the wind) become visible to the sensor.

Conversely, at constant speed VT, with decreasing sensitivity of the Doppler sensor (Vmin close to VT), then a0 tends towards 0. Because of this particular geometry, the first zone Al may be referred to by a person skilled in the art of radars or of aerial navigation as a "Doppler rose."

Figure 12:
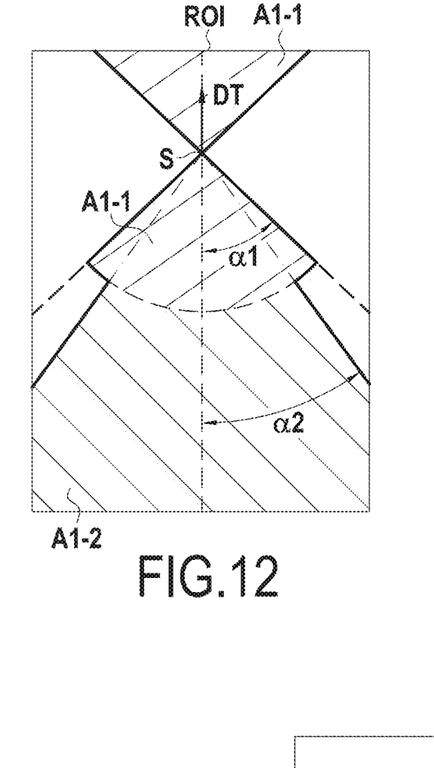
FIG. 12 shows two resulting first zones for two travel speeds of an object.

With reference to FIG. 12 there can be seen the first zone Al in an example in which the speed Vmin i associated with a point Ti of the region of interest ROI depends on the distance between that point Ti and the sensor S, and only on that distance. More precisely, in this figure, it is considered that:

the points Ti situated at a distance from the sensor S that is less than a limit distance RL are associated with a first threshold speed Vminl; and the points Ti situated at a distance from the sensor S that is greater than this limit distance RL are associated with a second threshold speed Vmin2.

This figure shows the situation in which the threshold speed Vminl is lower than the threshold speed Vmin2 such that al is greater than a2. Such a configuration may correspond to a scenario in which the sensitivity of the sensor is increased for the zone located in the proximity of the sensor, e.g. when the sensor is positioned in a zone that is unobstructed.

The geometry of the first zone Al is not necessarily made up of portions of angular sectors as shown in FIGS. 11 and 12. Specifically, with reference to FIG. 13, there is shown a first zone Al (union of the shaded portions) that corresponds to an embodiment in which the threshold speed Vmin i associated with the points Ti of the region of interest ROI takes account of the distance of the point Ti from the sensor, and also its bearing angle 0.

Figure 13:
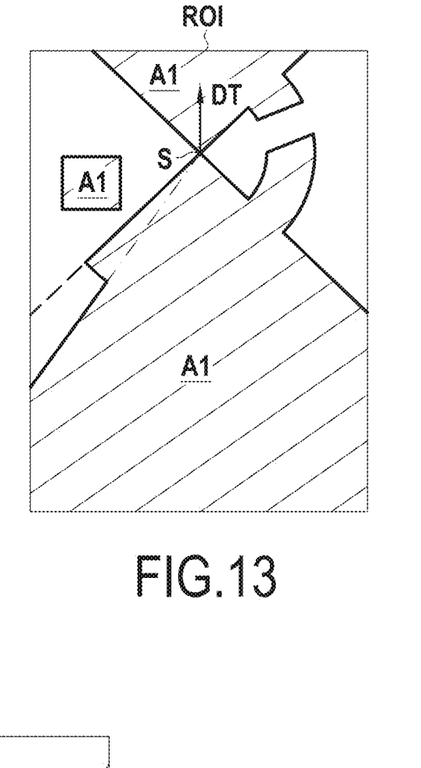
FIG. 13 shows the resultant of a plurality of first zones of arbitrary shapes.

In general manner, the shape of the first zone Al is arbitrary, this shape depending exclusively, for given speed VT and direction DT, solely on the threshold values Vmin i associated with the points Ti in the region of interest ROI.

Concerning the Second Zone A2

In accordance with the invention, the second zone A2 constitutes a coverage zone of the sensor Sin which the object T that is to be observed is observable, this coverage zone being defined by taking account at least of the intrinsic characteristics of the sensor S, the intrinsic characteristics of the object T, and also the position of the object T relative to the sensor S.

Figure 14:
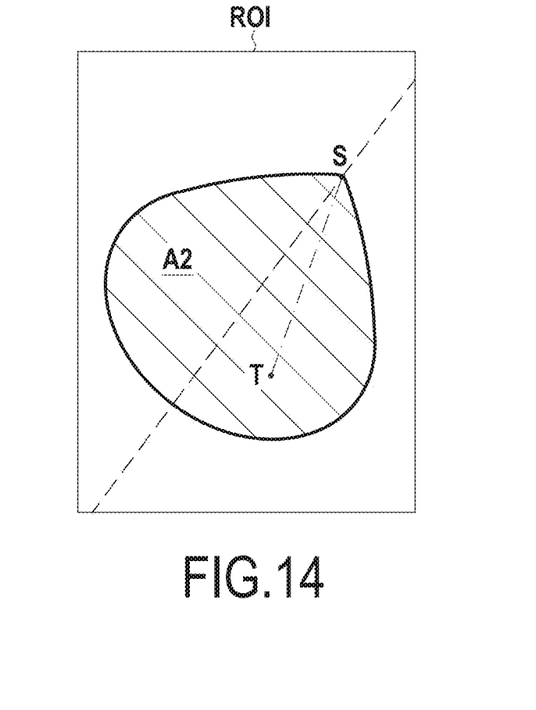
FIG. 14 shows an example of a coverage zone of the sensor for a given object.

It should be recalled that for a radar, the coverage of the radar corresponds to the zone in which an object of the size under consideration can reflect sufficient energy for it to be detected. In particular, it is possible to calculate the received power P by using the radar equation known to the person skilled in the art and based on the antenna pattern (gain in a given direction), on the distance to the object, and on the size of the object expressed as a radar cross-section (RCS) P=Pt·Gt·Gr·A2·cr/((4·n)3·R4) with:

Pt: transmitted power;
Gt/Gr: transmit receive gain;
A: wavelength;
cr: radar cross-section;

R: distance between the radar and the object. With reference to FIG. 14, the person skilled in the art of radars recognizes that this second zone is essentially in the form of a lobe in the particular situation in which the sensor has a directional antenna and consideration is given only to the main lobe of that antenna. In an embodiment where the sensor is anisotropic, it possesses a preferred direction generally referred to as the "boresight". In this situation, which is particularly representative when the sensor is a radar, a sonar, or a lidar, the second zone A2 also takes account of the orientation of the sensor relative to the object.

Concerning the Interference Zone A4

Figure 15A:
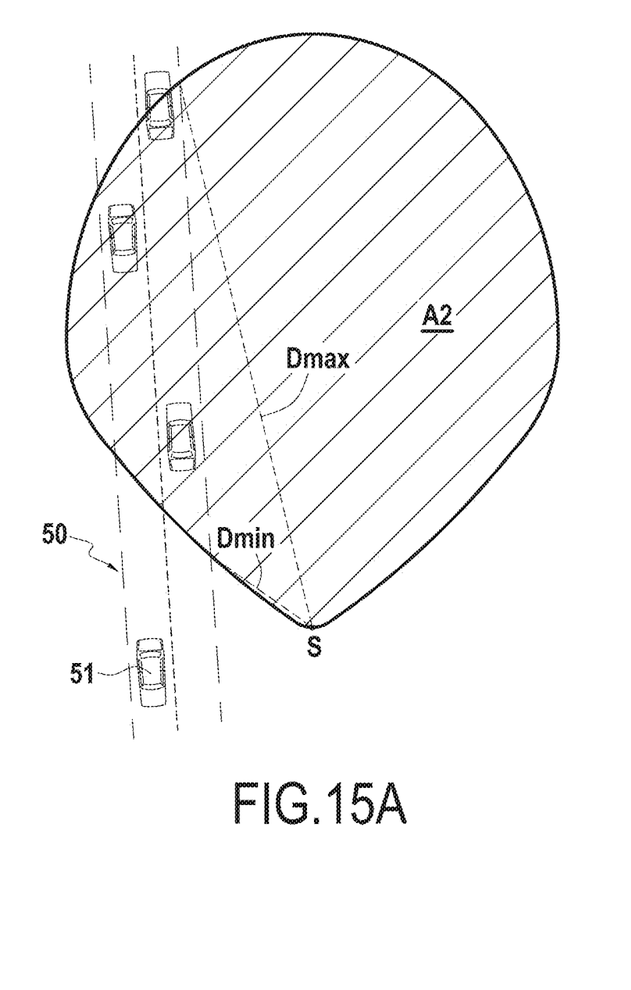
FIGS. 15A to 15C show an example of determining an interference zone in a particular implementation of the invention.

In accordance with the invention, an interference zone A4 is constituted by points in the region of interest that correspond to positions at which an object T might not be detected by a sensor S. An interference zone is typically due to the presence of interference sources, by way of example and as shown in FIG. 15A, to the presence of vehicles 51 traveling along a road 50 that passes through the region of interest ROI and in the coverage zone A2 of a sensor used for detecting human intrusions.

It should be observed that in this example the coverage zone that takes account of the intrinsic characteristics of vehicles traveling on the road is wider than the coverage zone of the sensor that takes account of the intrinsic characteristics of the objects that it is desired to detect.

Figure 15B:
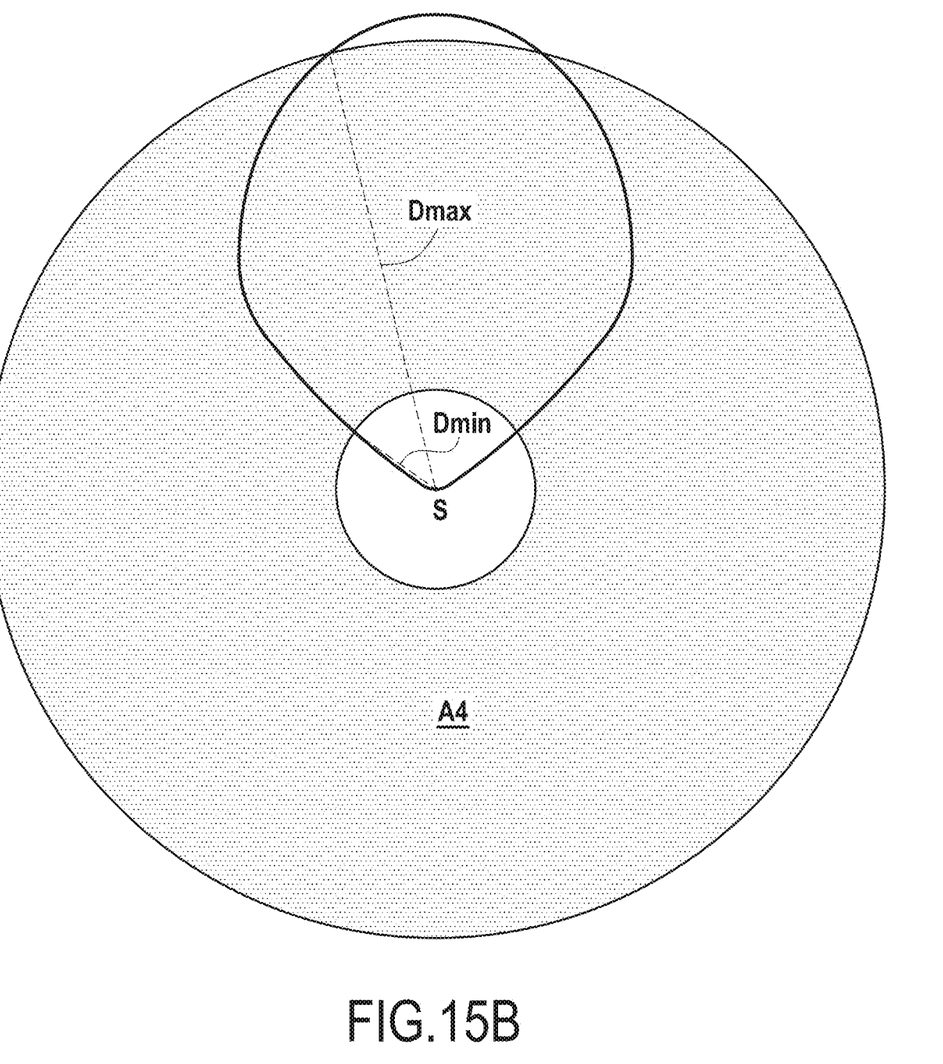
Figure 15C:
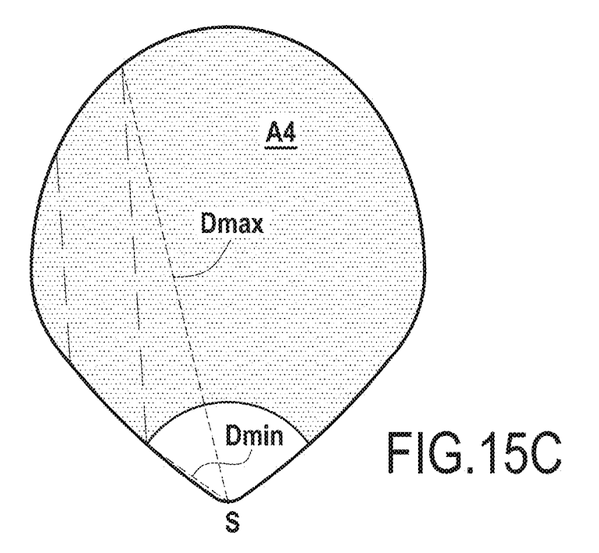

In a first example, the sensor Sis configured to observe and measure only distance and radial speed Vr. Under such circumstances, if the distance at which the vehicles are visible lies in the range Dmin to Dmax, the vehicles are seen by the sensor as having the same distance and radial speed characteristics as the objects to be observed that are situated in the range Dmin to Dmax, which objects might thus not be detected by the sensor. The interference zone A4 is thus constituted by points situated in the range Dmin to Dmax, i.e. the ring centered on the sensor S that is of inside radius Dmin and of outside radius Dmax, as shown in FIG. 15B. FIG. 15C shows the intersection between the interference zone A4 and the coverage zone A2.

It should be observed that certain sensors suitable for measuring radial speed are the subject of a known "folding" phenomenon that leads to objects traveling at high radial speed being confused with objects traveling at low radial speed.

In another example, the sensor Sis a continuous wave Doppler radar configured to observe and measure distance, radial speed Vr, and bearing by phase difference between the signals generated by the echoes received from spaced-apart sensors, as described above with reference to FIG. 1.

Figure 16:
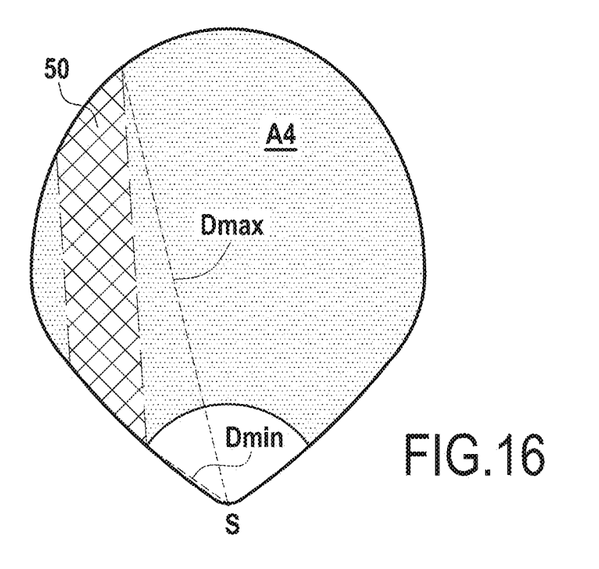
FIG. 16 shows an interference zone in another particular implementation of the invention.

In that embodiment, it is possible to determine the zone of false alarms generated by vehicles as showed by crosshatching in FIG. 16. Nevertheless, each individual receiver RX1 and RX2 operates like the sensor Sin FIG. 15A, such that the objects that are to be observed can also be confused in each of those individual receivers with false alarms generated by vehicles in each of the receivers, thus potentially making bearing measurements of the azimut ineffective or erroneous.

As in the above example, the interference zone A4 in the meaning of the invention, i.e. the zone corresponding to positions in which an object might not be detected by the sensor, is the masking zone defined by the ring centered on the sensor S and of inside radius Dmin and outside radius Dmax.

Figure 17:
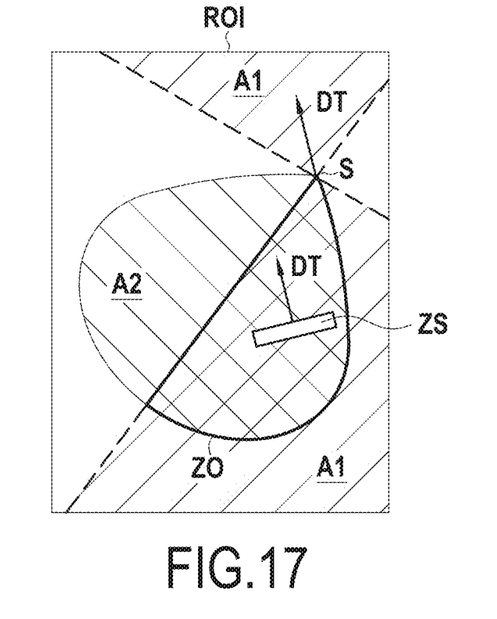
FIG. 17 shows an example of a surveillance zone and of an operational zone.

However, and in most advantageous manner, it is also possible in this example to distinguish within the interference zone, the zone of false alarms generated by vehicles and corresponding to the location of the road. Representation of an operational zone FIG. 17 shows in cross-hatching an operational zone ZO in an implementation of the invention. In this example, the operational zone ZO is the intersection between the first zone Al of FIG. 11 and the second zone A2 of FIG. 14. This operational zone ZO constitutes the set of positions in which an object traveling in the direction DT at the speed VT is visible to the sensor S.

The sensor Sas positioned in this way can provide effective surveillance of intrusions into a surveillance zone ZS by objects traveling at the speed VT in the direction DT, the surveillance zone ZS being constituted by a straight fence, as shown in this figure. Example of a method of assisting installing the sensor S With reference to FIG. 8, there follows a description of the main steps of a method of providing assistance in installing a sensor in accordance with a particular implementation of the invention.

Figure 8:
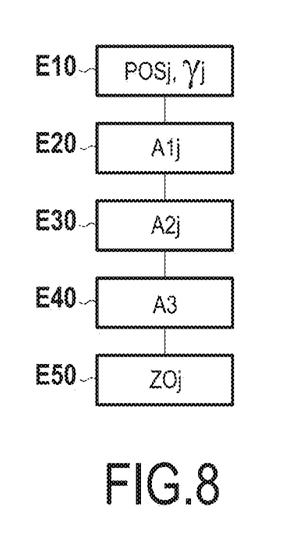
FIG. 8 is a flow chart showing the main steps of a method of assisting in installing a sensor in accordance with a particular implementation of the invention.

This method comprises a loop made up of steps El0 to E50, with each iteration of the loop serving to determine, for a different position POSj of the region of interest ROI, the operational geographical zone ZOj of said sensor S by simulating said sensor S being positioned at said position POSj.

More precisely, each iteration of the loop comprises:
a simulation step El0 for simulating positioning the sensor S in the region of interest ROI at a position POSj with an orientation yj.

In practice, the position POSj may be selected to occupy potential zones for positioning the sensor as predetermined by the operator, and by shifting position by steps of a determined size between two iterations;
a determination step E20 for determining a first zone Alj for each travel direction DT of the object T, as described above with reference to FIGS. 11 to 13;
a determination step E30 for determining a second zone A2*j* corresponding to the coverage zone of the sensor S, as described above with reference to FIG. 14;
optionally, depending on the option selected by the operator, a determination step E40 for determining potential shadow zones A3 in which the object Tis not detectable by the sensor when positioned in the position POSj; and
a determination step E50 for determining the operational zone ZOj by taking account of the intersection between the first zones Al, the second zone A2, and optionally the zone that is complementary to the shadow zones A3 in the region of interest ROI. The steps El0 to E50 show the main steps of a method of determining an operational zone for the sensor Sin the meaning of the invention for the sensor in the position POSj.

In a particular embodiment, the sensor possesses characteristics that are anisotropic. In this embodiment, the step E30 of the method of determining the operational zone serves to determine a second zone A2*jk* for each orientation of the coverage zone of the sensor S. Said method thus has two loops, iterating on different positions POSj in the region of interest ROI and iterating on the orientation k of the sensor.

Figure 18:
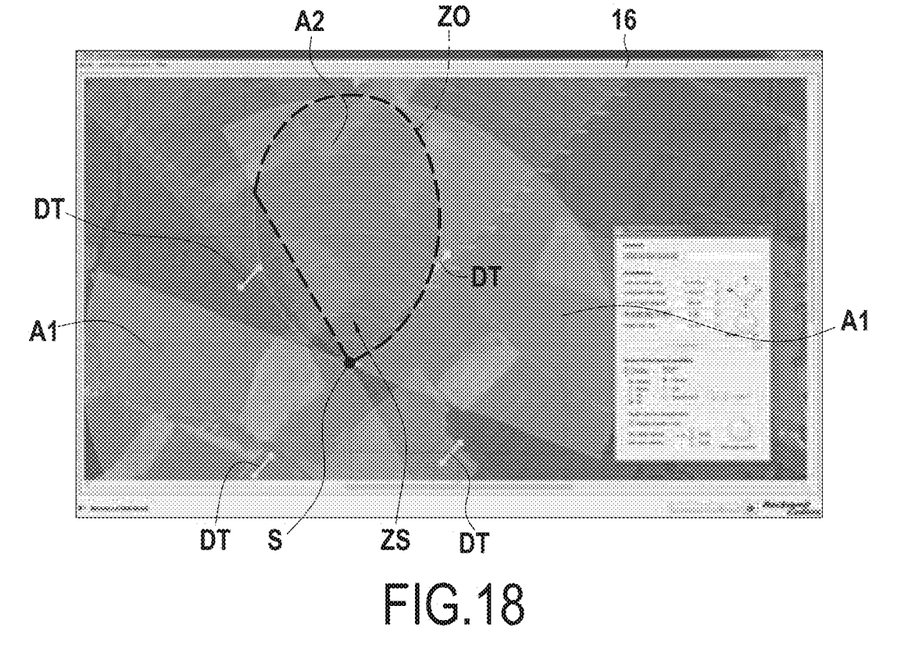
FIG. 18 shows a computer screen, a sensor, a surveillance zone, a first zone, a second zone, and an operational zone.

FIG. 18 shows the screen 16 of the computer 10 for a position POSj of the sensor S, the surveillance zone ZS, the first zone Alj, the second zone A2*j*, and the operational zone ZOj. In this example, the first zone Al is truncated beyond a certain distance that is set arbitrarily. In the presently-described implementation, once the operational zone ZOj has been determined for all of the positions POSj of the sensor S, the method of providing assistance in installing the sensor includes a determination step E60 for determining at least one preferred position POSopt for the sensor among the positions POSj, this preferred position serving to determine an optimized operational geographical zone ZOopt complying with an optimization criterion.

In the presently-described implementation, the optimized position POSopt for the sensor is the position that serves to maximize the area of the surveillance zone ZS that is covered by the operational zone ZOopt obtained for the position of the sensor. The optimized positions POSopt for the sensor may be marked on the screen 16 for the operator so as to enable the operator to install the sensor in that position in the region of interest.

The invention claimed is:

1. A determination method for determining at least one operational geographical zone in a region of interest, said zone being determined relative to a sensor configured to observe and measure the radial speed of an object traveling at a non zero minimum speed in the region of interest, the method comprising:
   (a) a step of simulating the position of said sensor in said region of interest at a position and in an orientation that are determined;
   (b) a step of determining at least one first zone of said region of interest that is constituted by points for each of which, said object at said point and traveling at a speed greater than or equal to said speed and in a given direction, would be seen from said sensor to have a radial speed greater than a threshold value defined for that point; and
   (c) a step of determining a second zone of said region of interest, the second zone constituting a coverage zone of said sensor in which said object is observable while taking account at least of the intrinsic characteristics of said sensor and of the intrinsic characteristics of said object, and also of the position of said object relative to said sensor; said at least one operational geographical zone being defined by taking account of the intersection between at least said first and second zones.

2. The method according to claim 1, wherein said threshold speeds defined for the various points of the region of interest are equal to a constant.

3. The method according to claim 1, wherein the threshold speed defined for at least one point of said region of interest is defined as a function of the position of that point relative to said sensor.

4. The method according to claim 3, wherein the threshold speed defined for at least one point of the region of interest is defined as a function of the distance between that point and the sensor.

5. The method according to claim 3, wherein the threshold speed defined for at least one point of the region of interest is defined as a function of the bearing of that point relative to a reference direction linked to the sensor.

6. The method according to any one of claim 3, wherein the threshold speed defined for at least one point of the region of interest is defined as a function of the elevation of that point relative to said sensor.

7. The method according to claim 1, further comprising a step of determining at least one shadow zone taking account of the characteristics of said region of interest, said at least one shadow zone being constituted by the points that correspond to positions at which said object is not detectable by the sensor when positioned thereat, and wherein said operational geographical zone is defined by taking account of the intersection between the complement of at least one of said shadow zones and said first and second zones.

8. The method according to claim 1, further comprising a step of determining an interference zone taking account of the characteristics of said region of interest, said interference zone being constituted by points corresponding to positions at which said objects might not be detected by the sensor when positioned at said position.

9. The method according to claim 8, characterized in that it comprises determining a plurality of said first zones, said first zones being determined for different travel directions of said object.

10. The method according to claim 9, comprising a set of representing the position of said sensor, of said at least one first zone, of said second zone, and optionally of said shadow zone and/or of said interference zone in said region of interest.

11. The method according to claim 9, wherein the first zones obtained for each of said directions are represented in different manners.

12. The method according to any one of claim 11, wherein said sensor is a Doppler radar.

13. A method of assisting in installing a sensor configured to observe and measure a radial speed of an object traveling at a non-zero minimum speed and in at least one given direction in a region of interest, the method comprising:
(a) at least one iteration, each iteration comprising determining an operational geographical zone of said sensor by simulating said sensor being positioned in said region of interest at a determined position and in a determined orientation;
(b) determining at least one preferred position among said positions enabling an optimized operational geographical zone to be determined in accordance with an optimization criterion; and
(c) reproducing said at least one preferred position.

14. A device for assisting installing a sensor that is configured to observe and measure the radial speed of an object traveling at a non-zero minimum speed and in at least one given direction in a region of interest, the device comprising:
a controller configured to execute at least one iteration, each iteration comprising determining an operational geographical zone of said sensor by simulating said sensor being positioned in said region at a determined position and in a determined orientation, by implementing a method of determining such a zone in accordance with claim 1;
a unit for determining at least one preferred position from among said positions enabling an optimized operational geographical zone to be determined in accordance with an optimization criterion; and
a unit for representing said at least one preferred position.

* * * * *